United States Patent [19]

Hirai

[11] Patent Number: 5,381,316
[45] Date of Patent: Jan. 10, 1995

[54] ELECTRONIC PART ASSEMBLY USING A SHAPE MEMORY ALLOY ELEMENT

[75] Inventor: Minoru Hirai, Kyoto, Japan
[73] Assignee: Rohm Co., Ltd., Kyoto, Japan
[21] Appl. No.: 45,594
[22] Filed: Apr. 9, 1993
[30] Foreign Application Priority Data May 15, 1992 [JP] Japan ................................. 4-148802

[51] Int. Cl.[6] .................................................. H05K 7/02
[52] U.S. Cl. ............................. 361/760; 361/761;
361/770; 361/807; 174/52.1; 174/255
[58] Field of Search ............... 361/760, 400, 401, 397,
361/399, 417, 761, 767, 770, 771, 748, 752, 796,
807; 174/52.3, 52.1, 255, 259, 260, 263;
257/667, 700

[56] References Cited
U.S. PATENT DOCUMENTS 4,034,468  7/1977  Koopman ............................... 29/628
4,970,575  11/1990  Soga et al. ............................. 357/72

FOREIGN PATENT DOCUMENTS 3190251  8/1991  Japan.
3241847  10/1991  Japan.

Primary Examiner—Leo P. Picard
Assistant Examiner—Young Whang
Attorney, Agent, or Firm—Nikaido, Marmelstein, Murray & Oram

[57] ABSTRACT

An electronic part assembly composed of electronic parts wherein a projecting electrode formed on an electrode pad is pressed against a wiring pattern of a circuit board. A cover member a arranged so as to cover the electronic parts, and has a leg portion designed to be joined to the circuit board. A shape memory alloy member is arranged between the cover member and the electronic parts to press a reverse side surface so that electric connection between the projecting electrode and the wiring pattern can be maintained.

5 Claims, 5 Drawing Sheets

ELECTRONIC PART ASSEMBLY USING A SHAPE MEMORY ALLOY ELEMENT

FIELD OF THE INVENTION

The present invention relates to an electronic part assembly, and more particularly to an electronic part assembly wherein a wiring pattern in a circuit board is electrically connected with each electrode terminal of chips in electronic parts.

BACKGROUND OF THE INVENTION

In liquid crystal display devices, print heads or the like, conventionally, electronic parts, such as a chip of a semiconductor integrated circuit, are connected with a wiring pattern by the so-called face down bonding wherein electrodes projecting from the electronic parts are directly connected with the wiring pattern of a circuit board without using leads.

In the electronic part assembly, a whole surface of a circuit board is covered with synthetic resin such as epoxy resin after assembling the electronic parts so that the electronic parts will not fall off after assembling. However, in the electronic part assembly, a great number of electronic parts are closely arranged. Accordingly, if one of the electronic parts is to be replaced with alternatives, the synthetic resin fixing the integrated circuits need to be fused by heating. As a result, the other integrated circuits, which do not need to be removed, would be undesirably affected by heat.

In order to solve such a problem associated with the prior art, an electronic part assembly of a semiconductor device has previously been proposed and such a device is disclosed in Japanese Unexamined Patent Publication No. 241847/1991. The assembly comprises, as shown in FIG. 9, an integrated circuit 11 mounted on a circuit board 7, a projecting electrode 12 formed under an electrode pad 11a of the integrated circuit 11 and pressed against a wiring pattern 6 formed on the circuit board 7 to come in contact therewith, a cover member 13 covering the integrated circuit 11 and bonded at its leg 13a to the circuit board 11, and a rubber member 14 disposed between an internal face 13b of the cover member 13 and a reverse side surface 11b of the integrated circuit 11 so as to press the integrated circuit 11 downward and thereby to maintain electrical contact between the projecting electrode 12 and the wiring pattern 6. The assembly thus arranged allows the integrated circuit 11 to be readily replaced with its alternative without substantially affecting other integrated circuits. This is because the integrated circuit 11 can be removed only by fusing adhesive bonding the leg 13a to the circuit board 7.

With such a structure, however, the rubber member 14 is likely to deteriorate if the structure is used under an environment of a high-temperature of for example, more than 85° C. and a high-humidity of, for example, more than 85%, the resilience of the rubber member 14 decreases. This leads to a decrease in the pressing force of the rubber member 14 against the integrated circuit 11. Accordingly, there arises a problem of a continuity failure between the projecting electrode 12 and the wiring pattern 6. Further, there is such a problem that a cover member is bonded to the rubber member by pressing it by a force more than a compression force of the rubber member when the semiconductor device is assembled.

SUMMARY OF THE INVENTION

The present invention has been attained in view of the above-mentioned problems attributable to the prior arts. Thus, it is an object of the present invention to provide an electronic part assembly wherein conductivity failure between a projecting electrode and a wiring pattern is prevented.

According to the present invention, there is provided an electronic part assembly comprising:

(a) electronic parts wherein a projecting electrode formed on an electrode pad is pressed against a wiring pattern of a circuit board;

(b) a cover member arranged so as to cover the electronic parts, and having a leg portion designed to be joined to the circuit board; and (c) a shape memory alloy member being arranged between the cover member and the electronic parts to press a reverse side surface of the electronic parts so that electric connection between the projecting electrode, and the wiring pattern can be maintained.

It is preferable that the electronic part is a semiconductor chip.

It is preferable that the circuit board is a printed bard and a wiring pattern of the printed board is formed of copper.

It is preferable that the shape memory alloy is composed of at least one of alloys selected from the group consisting of Ti-Ni, Ag-Cd, Cu-Au-Zn, In-Tl, In-Cd and Ti-Ni-Cu.

It is preferable that a leg portion of the cover member is bonded to the circuit bard by using a bond made of UV-setting resin.

In the present invention, the shape memory alloy member disposed between the cover member and the electronic part is first crushed, then heated to a temperature higher than its critical temperature to restore its original shape. The restitutive force of the shape memory alloy member serves to maintain contact between the projecting electrode and the wiring pattern. Therefore, a continuity failure between the projecting electrode and the wiring pattern will not occur even if the assembly is used in a high-temperature and high-humidity environment.

DETAILED DESCRIPTION

Now, the present invention will be described in more detail by way of an embodiment with reference to the drawings.

Figure 1:
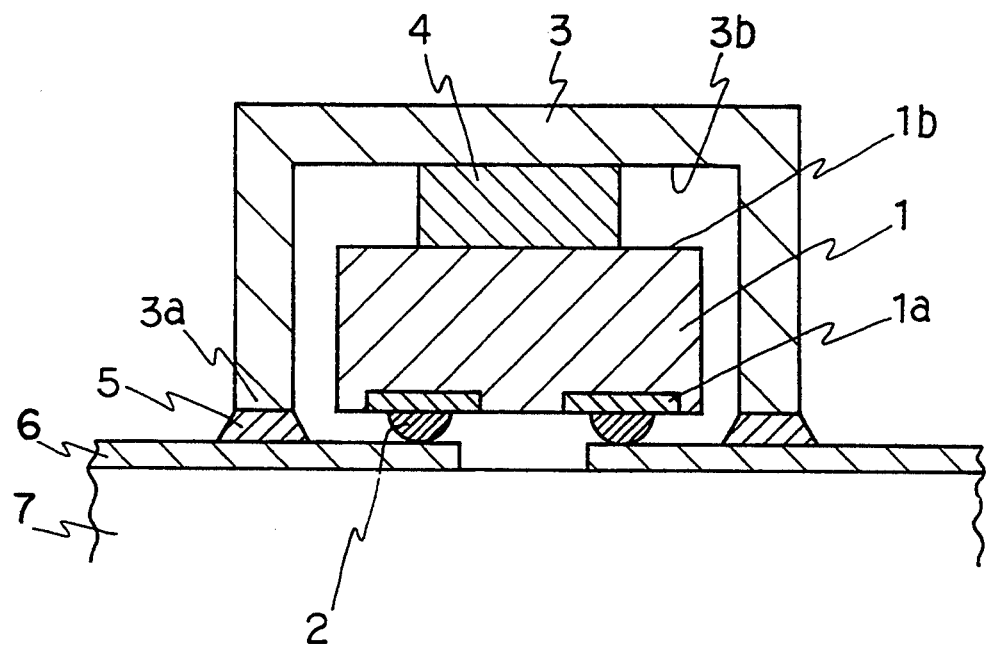
FIG. 1 is a schematic longitudinal section showing an assembly portion of a semiconductor chip of an electronic part assembly embodying the present invention.
Figure 2:
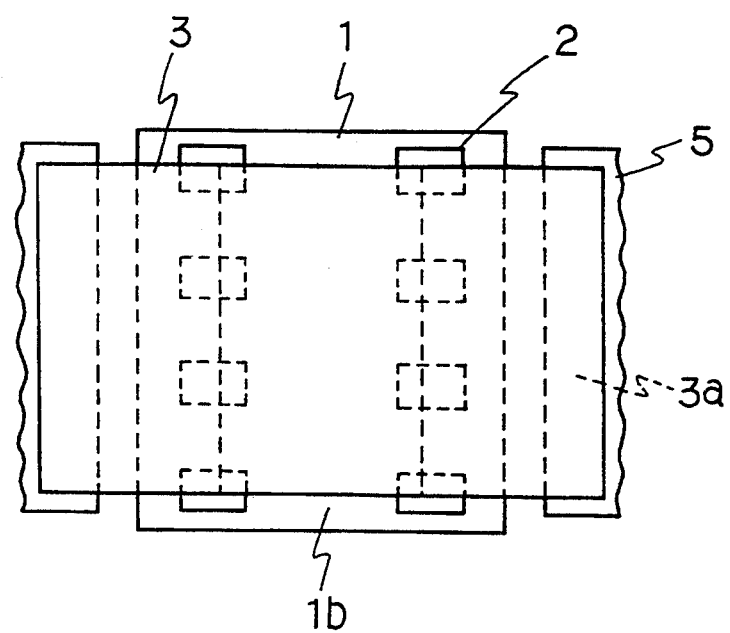
FIG. 2 is a schematic plan view of the assembly in FIG. 1.
Figure 3:
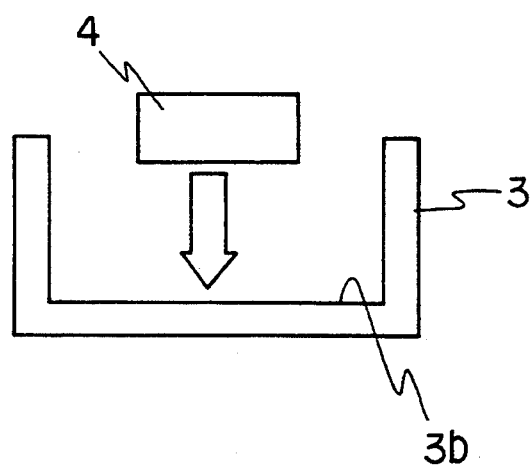
FIGS. 3 to 8 are each a schematic section illustrating a producing step of the assembly portion embodying the present invention.
Figure 4:
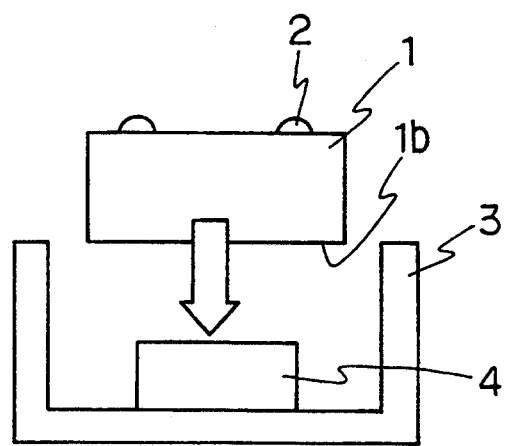
Figure 5:
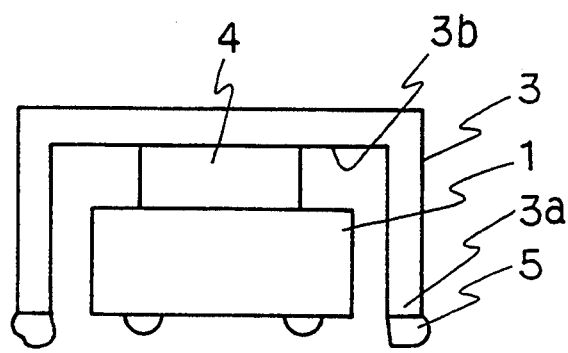
Figure 6:
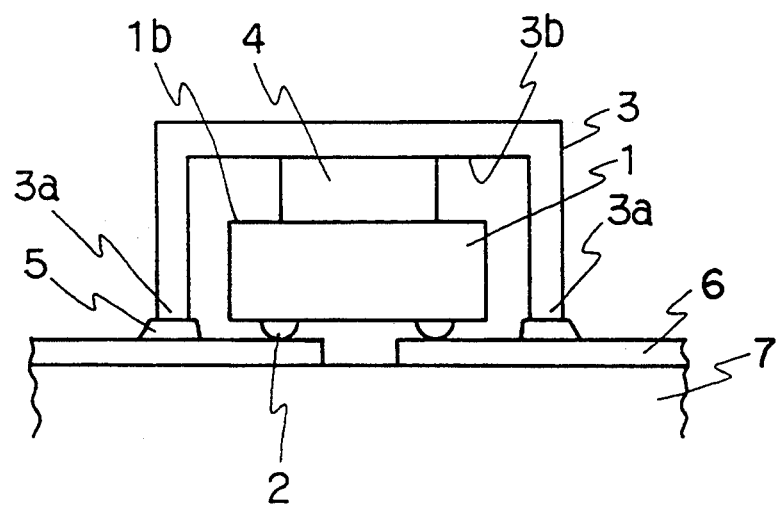
Figure 7:
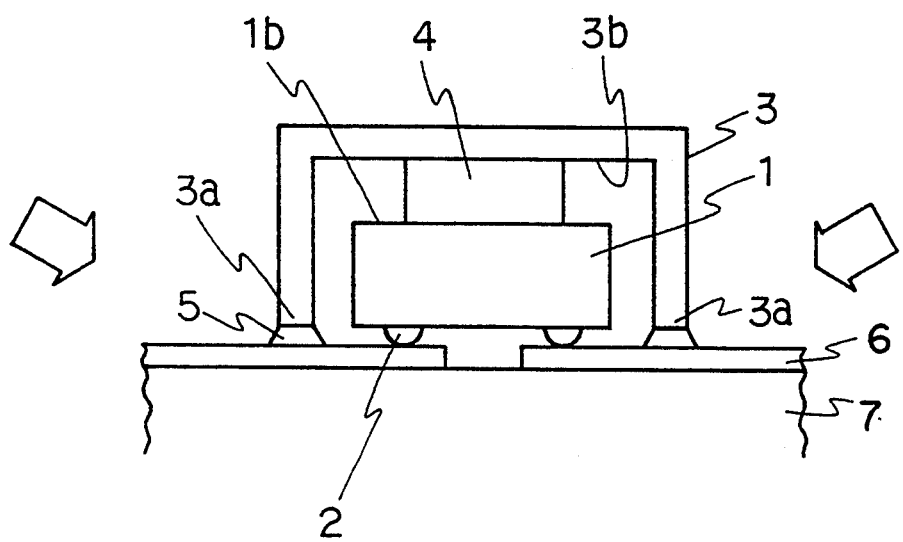
Figure 8:
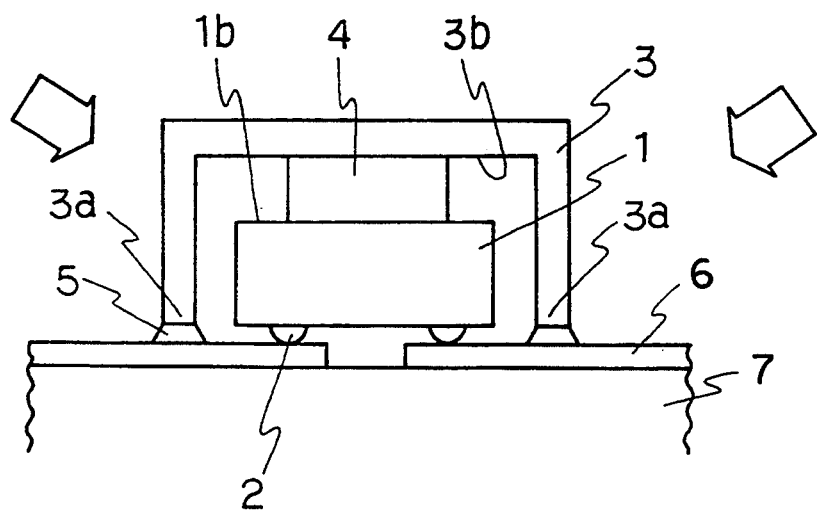
Figure 9:
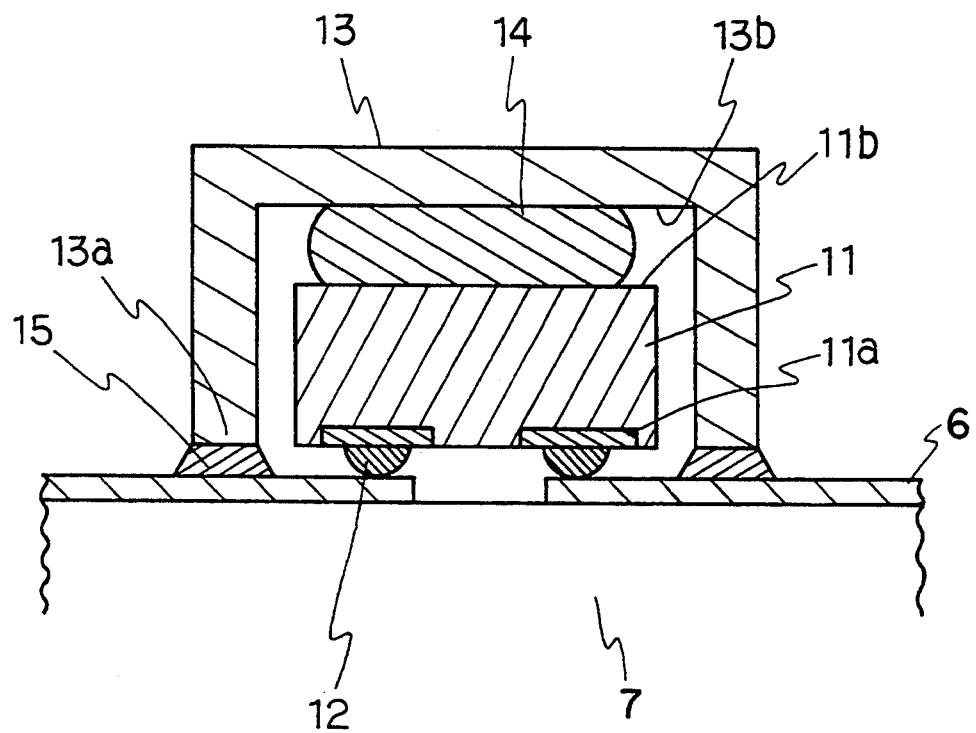
FIG. 9 is a schematic section showing a conventional structure for mounting a semiconductor device.

In the drawings, numeral 1 denotes an integrated circuit chip which is an example of an electronic part, numeral 2 denotes a projecting electrode, numeral 3 denotes a cover member, numeral 4 denotes a shape memory alloy member, numeral 5 denotes a resin portion, 6 denotes a wiring pattern, and 7 denotes a circuit board. In the embodiment of an electronic part assembly in accordance with the present invention, as shown in FIGS. 1 and 2, the integrated circuit 1 is covered with the cover member 3, a leg portion 3a of which is bonded to the circuit board 7 by means of an adhesive, for example, made of a UV-setting resin so that the resin portion is interposed between the leg portion 3a and the wiring pattern 6. The shape memory alloy member 4 is disposed between an internal face 3b of the cover member 3 and a reverse side surface 1b of the integrated circuit 1. The shape memory alloy member 4 can preferably be composed of a shape memory alloy of Ti-Ni type, Ag-Cd type, Au-Cd type, Cu-Au-Zn type, In-T1 type, In-Cd type, Ti-Ni-Cu type or the like. The restitutive force of the shape memory alloy member 4 serves to press the integrated circuit 1 toward the circuit board 7 and, hence, press the projecting electrode 2 against the wiring pattern 6. Thus, pressure contact between the projecting electrode 2 disposed on an electrode pad 1a of the integrated circuit chip 1 and the circuit board 7 can be stably maintained to assure continuity therebetween.

The cover member 3 is made of solid material such as metal or resin. The cover member 3 having a "c"-like-shape or box-like-shape is normally arranged in such a manner as to cover the integral circuit 1. The leg portion 3a of the cover member 3 is bonded to the circuit board 7. The shape memory alloy member 4 is interposed between the internal face 3b of the cover member and the reverse side surface 1b so that the shape memory alloy member presses the projecting electrode 2 and wiring board due to a restoring force of the shape memory alloy member. The force on which the shape memory alloy member presses is suitably in the range of about 5 gf to about 10 gf per single projecting electrode. The shape of the shape memory alloy member corresponding to the distance between the cover member 3 and the integral circuit chip is determined so that the force, which is totally obtained by multiplying the pressing force of the shape memory alloy member by the number of the projecting electrodes, can be generated. Further, the adhesive force wherein the cover member 3 is bonded to the circuit board 7 is required to be about 3 to 5 times as much as the pressing force of the projecting electrode 2. The resin portion 5 composed of the adhesive is used for bonding the cover member to the projecting electrode, such a bond as to be resistant to the force of the pressing force of the projecting electrode 2. As the adhesive 5, the above-mentioned UV-setting resin, thermosetting, resin or the like can be used.

Next, a process for assembling an integral circuit chip in accordance with the present invention will be described with reference to FIGS. 3 to 8.

Step 1: Turning the cover member 3 upside down, and fixing the shape memory alloy member 4 to the internal face 3b of the cover member 3 at a predetermined location with an adhesive such as epoxy resin (refer to FIG. 3).

Step 2: Fixing the integrated circuit chip 1 on the shape memory alloy member 4, for example, with epoxy resin, the same adhesive as that used in Step 1 (refer to FIG. 4).

Step 3: Overturning the cover member 3, and applying the adhesive 5, for example, made of UV setting resin to the leg portion 3a of the cover member 3 while holding the cover member 3 using a chuck or the like (refer to FIG. 5).

Step 4: Positioning the cover member 3 on the circuit board 7 so as to locate the projecting electrode 2 on a predetermined position of the wiring pattern 6, and pressing the cover member 3 against the circuit board 7 while crushing the shape memory alloy member 4 (refer to FIG. 6).

Step 5: Hardening the adhesive 5 by irradiation of ultraviolet ray using a mercury lamp or a metal halide lamp, intensity of which is 200 mJ for about 0.5 to 1 min (refer to FIG. 7).

Step 6: Heating the shape memory alloy member 4 to a temperature higher than its critical temperature, for example, to about 150° C. so as to have the shape memory alloy member 4 express its restitutive force (refer to FIG. 8). This restitutive force of the shape memory alloy member 4 serves to maintain contact between the projecting electrode 2 and the wiring pattern 6 thereby assuring continuity therebetween.

Now, it is assumed that the integrated circuit chip 1 is sized 3.5 mm $\times$ 5.6 mm to have an area of 19.6 mm$^2$, and has 100 projecting electrodes each requiring a pressing force of 40 g for assuring satisfactory contact with the wiring pattern 6, hence 4 kg in total. Therefore, the pressing force to be exerted on the reverse side surface 1b of the integrated circuit chip 1 is 4 kg/19.6 mm$^2$, i.e., 204 g/mm$^2$. This value of the pressing force can be obtained if the shape memory alloy member 4 is crushed by about 20%. On the other hand, assuming that the adhesive strength of the UV-setting adhesive 5 is 3 kg/mm$^2$, the leg portion 3a of the cover member 3 needs to have an area of the base of 4 kg/3 kg/mm$^2$, i.e., approximately 1.33 mm$^2$. Thus, if the size of the cover member, crushing rate of the shape memory alloy member, and a contact area of the shape memory alloy member with the integrated circuit are appropriately determined depending on the size of the integrated circuit, the number of the projecting electrodes, and the size of each of the projecting electrodes, a proper and uniform pressing force can be obtained against an integrated circuit of any size. It should be noted that the above assembling process can be altered as follows; the projecting electrode 2 is first positioned on the wiring pattern 6, then the integrated circuit chip 1 is provisionally fixed using an adhesive or the like, followed by placing the shape memory alloy member 4 on the reverse side surface 1b of the integrated circuit chip 1.

Further, the cover member 3 can be shaped box-like to seal up the damp-proof of the integrated circuit 1 thereby. In this case, moisture resistance of the integral circuit chip can be improved.

Although even with the electronic part assembly of the present invention, it is needed to fuse the adhesive 5 which bonds the leg portion 3a of the cover member 3 to the circuit board 7 if the integrated circuit 1 is to be replaced with another one, other integrated circuits adjacent the integrated circuit 1 are affected little by such heating. This is because the adhesive 5 is present in a very localized area, or under the leg portion 3a only, unlike the conventional structure wherein an integrated circuit is entirely fixed with resin.

In the above-mentioned example, such an example, that the integral circuit chip is assembled on the circuit board is explained. It is not limited to the case wherein the integral circuit chip is assembled on the circuit board. Therefore, in accordance with the present invention, the other electronic parts, for example, a semiconductor element such as a transistor, a diode, or any kind of sensor, a capacitor or the like can be assembled on the circuit board.

In addition, in the electronic part assembly of the present invention, the projecting electrode 2 and the wiring pattern 6 are directly in contact with each other without only interposition such as a conductive paste or an adhesive containing conductive fine particles. Accordingly, the contact resistance therebetween can be reduced.

As has been described, according to the present invention pressure contact between a projecting electrode and a wiring pattern is maintained by the restoring force of a shape memory alloy member to assure electrical continuity therebetween. Accordingly, a continuity failure will not occur even if the structure of the present invention is used in a high-temperature and high-humidity environment and high reliability can be realized. Furthermore, when a certain electronic part is replaced with a new one, it can be done without affecting any other parts.

Though several embodiments of the present invention are described above, it is to be understood that the present invention is not limited only to the abovementioned embodiment, and various changes and modifications may be made in the invention without departing from the spirit and scope thereof.

What is claimed is:

1. An electronic part assembly comprising:
    (a) electronic parts wherein a projecting electrode, formed on an electrode pad of said electronic parts, is pressed against a wiring pattern of a circuit board;
    (b) a cover member arranged so as to cover said electronic parts, and said cover member having a leg portion designed to be joined to said circuit board; and
    (c) a shape memory alloy member, arranged between said cover member and said electronic parts, said shape memory alloy member pressing a reverse side surface of said electronic parts so that electric connection between said projecting electrode and said wiring pattern is maintained.
2. An electronic part assembly of claim 1, wherein the electronic Dart is a semiconductor chip.
3. An electronic part assembly of claim 1, wherein the circuit board is a printed board and a wiring pattern of said printed board is formed of copper.
4. An electronic part assembly of claim 1, wherein the shape memory alloy is composed of at least one of alloys selected from the group consisting of Ti-Ni, Ag-Cd, Au-Cd, Cu-Au-Zn, In-T1, In-Cd and Ti-Ni-Cu.
5. An electronic part assembly of claim 1, wherein said leg portion of the cover member is bonded to the circuit board by using a bond made of UV-setting resin.

* * * * *